United States Patent [19]

Wasserman

[11] Patent Number: 4,595,794

[45] Date of Patent: Jun. 17, 1986

[54] COMPONENT MOUNTING APPARATUS

[75] Inventor: Norman Wasserman, Columbus, Ohio

[73] Assignee: AT&T Bell Laboratories, Murray Hill, N.J.

[21] Appl. No.: 591,312

[22] Filed: Mar. 19, 1984

[51] Int. Cl.⁴ ............................ H05K 7/12; H05K 1/18
[52] U.S. Cl. ................................ 174/138 G; 248/505; 339/17 CF; 361/403
[58] Field of Search .................... 174/138 G; 361/403, 361/418, 419; 339/17 CF; 248/500, 505, 510

[56] References Cited

U.S. PATENT DOCUMENTS

| | | | |
|---|---|---|---|
| 3,131,896 | 5/1964 | Ingraham | 248/505 X |
| 3,335,327 | 8/1967 | Damon et al. | 174/138 G X |
| 3,533,589 | 10/1970 | Schellmann | 248/500 |
| 3,749,347 | 7/1973 | Schumer | 174/138 G X |
| 3,757,271 | 9/1973 | Judge et al. | 339/17 CF |
| 3,825,876 | 7/1974 | Damon et al. | 361/403 X |
| 3,873,173 | 3/1975 | Anhalt | 339/17 CF |
| 4,164,003 | 8/1979 | Cutchaw | 361/403 |
| 4,340,266 | 7/1982 | Grovender | 339/17 CF |
| 4,390,220 | 6/1983 | Benasutti | 339/17 CF |
| 4,513,353 | 4/1985 | Bakermans et al. | 174/52 FP X |

Primary Examiner—Laramie E. Askin
Attorney, Agent, or Firm—Dwight A. Marshall

[57] ABSTRACT

Apparatus for positioning a component on a circuit board and aligning terminals of the component with circuitry of the circuit board. The apparatus comprises a generally rectangular insulating member having index pins located on the outer edge thereof for insertion between adjacent terminals of the component. Registration pins positioned on the bottom of the insulating member engage the circuit board to enable the insulating member to accurately align each component terminal with corresponding circuitry of the circuit board.

10 Claims, 3 Drawing Figures

COMPONENT MOUNTING APPARATUS

BACKGROUND OF THE INVENTION

1. Field of the Invention

This invention relates to apparatus for mounting components on circuit boards. In particular, it relates to apparatus for use in positioning and aligning terminals of a component with circuitry of a circuit board.

2. Description of the Prior Art

Integrated circuit modules oftentimes called chips contain a variety of miniaturized electronic circuitry and are widely used on printed wiring circuit boards manufactured by the Electronics and Communications Industry to form large composite electrical circuits. A typical chip is a small modular package located on a ceramic substrate and contains electronic circuitry coupled to leads that extend to contacts or terminals positioned about the perimeter of the substrate.

Socket apparatus has been developed for use in mounting the circuit modules, hereinafter referred to as components, onto circuit boards and interconnecting the components with printed circuitry of the circuit board. In yet another arrangement, receptacle apparatus is mounted on a circuit board to receive and secure a component onto the circuit board. As components are constructed with more complex circuitry such as microprocessors each component has more contacts and terminals and requires large complex sockets and receptacles thereby imposing demands for large amounts of space on a circuit board. Components are sometimes assembled onto a circuit board by soldering the terminals of the component directly to the circuit board. Although this method eliminates the use of sockets and receptacles designed to receive the components a problem arises in positioning and aligning the contacts and terminals of the component with circuitry of the circuit board prior to the soldering process.

Accordingly, a need exists in the art for apparatus arranged to position and align a component with respect to a circuit board prior to soldering the component terminals to circuitry of the circuit board.

SUMMARY OF THE INVENTION

The foregoing and other problems are solved and a technical advance is achieved by apparatus arranged to position a component on a circuit board and align the component terminals with circuitry of the circuit board. The component positioning apparatus comprises a generally rectangular insulating member having index projections extending outwards from the edges thereof for insertion between adjacent terminals of the component. Pins projecting from the bottom of the insulating member are provided for insertion into the circuit board to enable the index projections to align the component terminals with circuitry of the circuit board.

In accordance with the invention an insulating member for positioning a component on a circuit board and having index projections for insertion between adjacent terminals of the component to align the component terminals with circuitry of the circuit board comprises projections extending vertically upward from the insulating member and a shoulder portion on registration pins extending downward from the insulating member to maintain the component in a spaced apart relationship with the circuit board.

Also in accordance with the invention apparatus for positioning a component on a circuit board and having index projections for insertion between ones of the component terminals and registration pins engaging the circuit board to align the component terminals with circuitry of the circuit board comprises a spring member having end sections formed to grasp edges of the circuit board and a center section formed to engage the component and maintain the terminals thereof in engagement with circuitry of the circuit board.

DESCRIPTION OF THE DRAWINGS

The foregoing as well as other objects, features and advantages of the invention will be more apparent from a description of the drawings in which.

DESCRIPTION OF THE INVENTION

1. Apparatus Description

Figure 1:
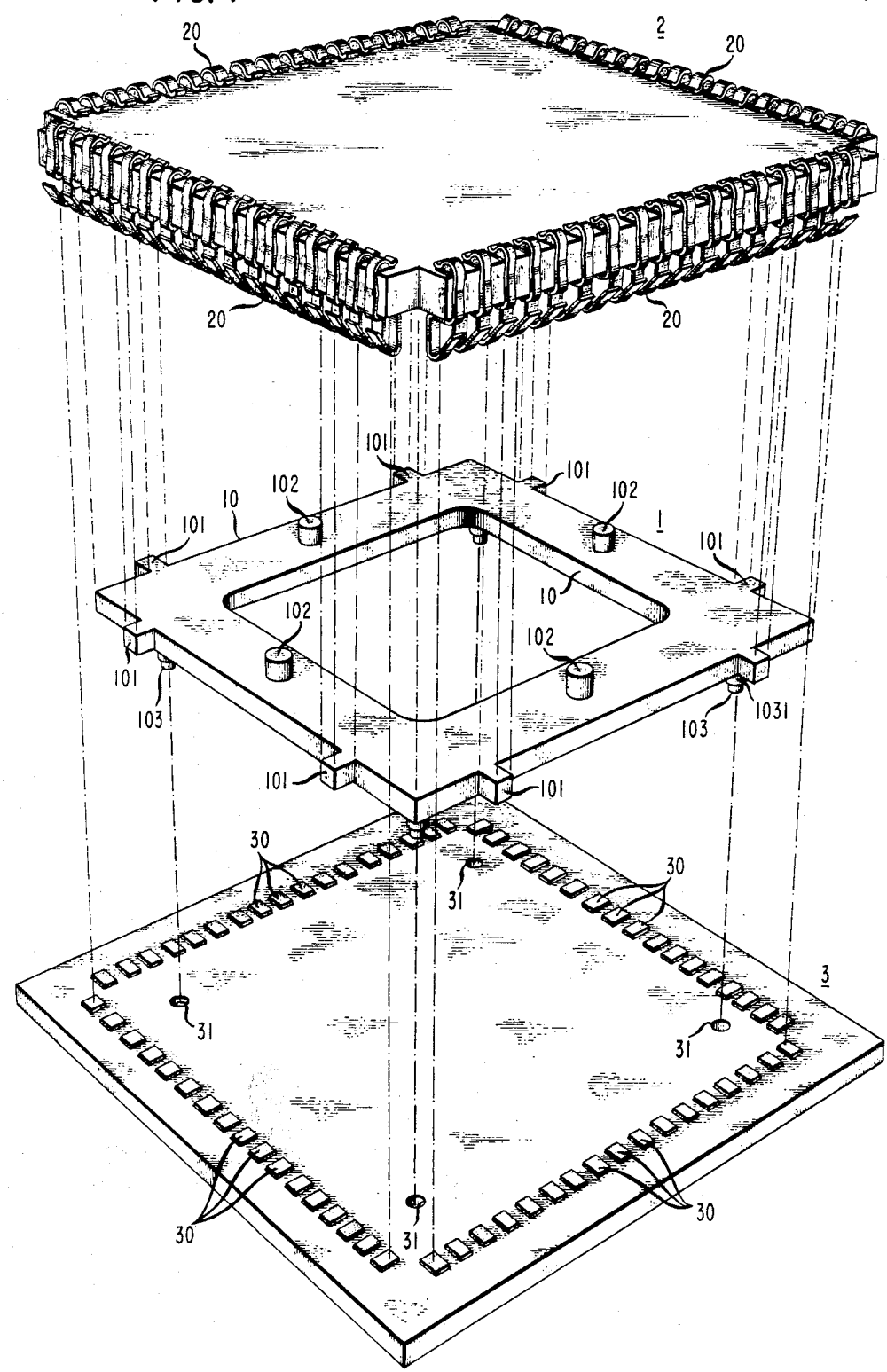
FIG. 1 is a perspective view showing apparatus of the instant invention for positioning a component on a circuit board and aligning the terminals thereof with circuitry of the circuit board.

Referring to the drawing and more specifically to FIG. 1 of the drawing, the apparatus 1 shown therein is intended for use in positioning component 2 on a circuit board 3 and aligning terminals 20 of component 2 with circuitry 30 of circuit board 3. Component 2 is a modular package containing a chip located on a ceramic substrate with the chip having a wide variety of microelectronic circuitry coupled to terminals 20 located around the perimeter of the substrate. A terminal 20 may be a contact spring arranged to clip onto an edge of the substrate and engage contact surfaces located on top and bottom surfaces of component 2 which are connected with the electronic circuitry of the chip.

The apparatus includes a generally rectangular member 1 formed of an electrical insulating material, such as polyphenylene sulfide, and is sized to be located beneath component 2 within the confines of terminals 20 or contact springs. The insulating member comprises pairs of opposing rectangular elements 10 joined together at the ends to form a quadrilateral member sized to conform to the edge dimensions of component 2. Rectangular elements 10 have a pair of index projections 101 each located a predetermined distance from the end and each extending horizontally outward from an edge of rectangular element 10 and are of a size to be inserted between adjacent terminals 20 or contact springs as insulating member 1 is fitted beneath component 2.

Apparatus 1 also has a number of registration pins 103 projecting vertically downward from the bottom of insulating member 1. Each registration pin 103 is intended for insertion into a corresponding datum hole 31 of circuit board 3 so as to position insulating member 1 to enable index projections 101 to align each terminal 20 or contact spring of component 2 with a corresponding contact pad 30 coupled with the printed wiring of circuit board 3.

In addition to index projections 101 and registration pins 103, insulating member 1 has spacer projections 102 extending vertically upward from the top surface thereof. Each registration pin 103 extending downward from a bottom surface of insulating member 1 has a shoulder portion 1031 terminating in pin 103 intended for insertion into datum hole 31 of circuit board 3. Projections 102 and the shoulder portion 1031 of registration pins 103 function to maintain component 2 in a spaced apart relation with respect to circuit board 3.

2. Apparatus Assembly

Figure 3:
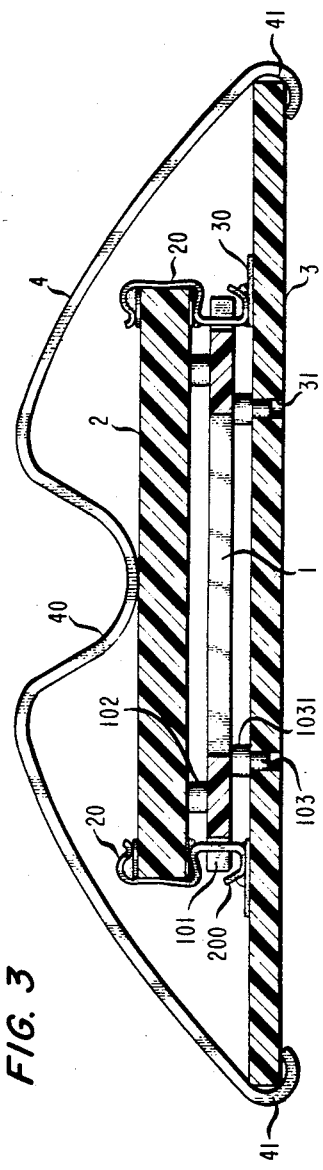
FIG. 3 is a cross-sectional view of the assembled component positioning and aligning apparatus set forth in FIGS. 1 and 2.

In assembly, FIG. 3 of the drawing, insulated member 1 is located beneath component 2 with projections 102 positioned flush against the bottom surface of component 2 and with index projections 101 each inserted between adjacent terminals 20 or contact springs of component 2. Component 2 and the attached insulated member 1 are then positioned on circuit board 3 such that registration pins 103 are inserted into datum holes 31 with the shoulder portion 1031 positioned flush against the upper surface of circuit board 3. With registration pins 103 inserted into circuit board datum holes 31, index projections 101 inserted between adjacent terminals 20 or contact springs of component 2 function to align contact surfaces 200 of component terminals 20 with and in the center of corresponding contact pads 30 of circuit board 3. Circuit board 3 may then be reflow soldered such that each aligned terminal contact surface 200 of component 2 is electrically connected with a contact pad 30 of circuit board 3. Vertical projections 102 and shoulder portion 1031 of pins 103 maintain component 2 in a spaced apart relationship with respect to circuit board 3 so that the flux and debris remaining from the reflow solder operation may be flushed from circuit board 3 underneath component 2 and from around connections of component terminals 20 and contact springs with contact pads 30.

Figure 2:
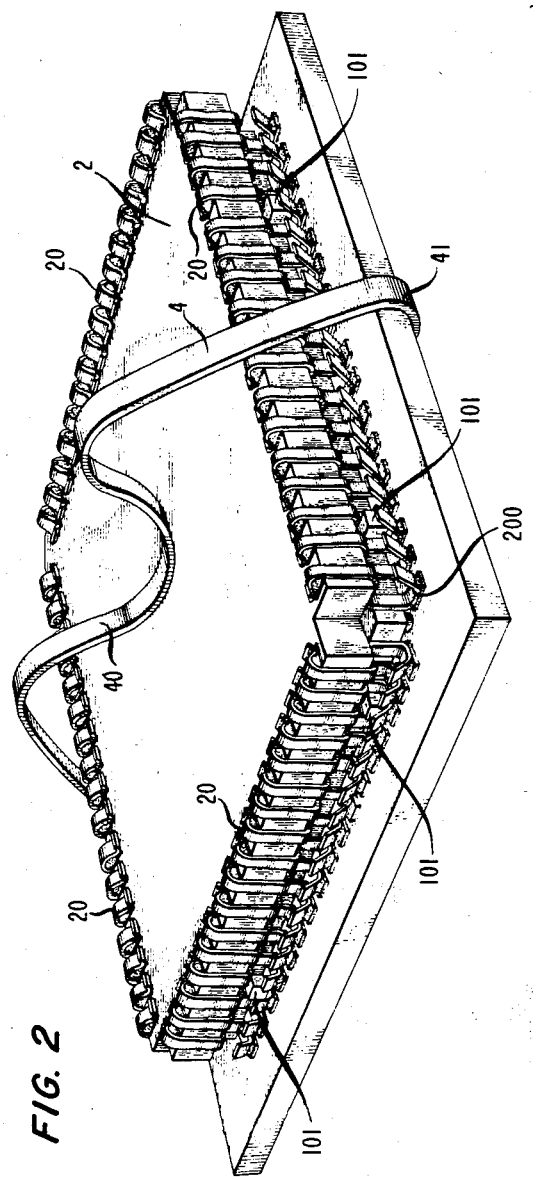
FIG. 2 is a perspective view showing the assembled component positioning and aligning apparatus of FIG. 1.

Oftentimes during the assembly of circuit boards it becomes necessary to carry or transfer component 2 and circuit board 3 from one work location to another. Spring member 4, set forth in FIGS. 2 and 3 of the drawing, is arranged to clamp component 2 onto circuit board 3 such that the assembly may be transported between work locations. In the present embodiment of the invention spring member 4 is formed of a resilience material to have a generally U-shaped center section 40 with end sections 41 configured to grasp an edge of circuit board 3. To prepare component 2 and circuit board 3 for transportation, center section 40 is positioned to engage component 2 and the end sections 41 secured to the edge of circuit board 3 to maintain component terminal contact surfaces 200 in engagement with contact pads 30 of circuit board 3. Prior to the solder reflow operation spring member 4 may be removed or left in place. An interference fit of registration pins 103 in datum holes 31 and the insertion of index projections 101 between adjacent component terminals 20 maintain contact surfaces 200 in engagement with circuit board contact pads 30 during the soldering operation.

SUMMARY

It is obvious from the foregoing that the facility, economy, and efficiency of mounting components on circuit boards may be substantially enhanced by apparatus arranged to mount a component on a circuit board and align the terminals of the component with circuitry of the circuit board. It is further obvious that apparatus having index projections for insertion between adjacent terminals of a component and registration pins projecting from the bottom thereof for insertion into a circuit board to enable the index projections to align the component terminals with circuitry of the circuit board facilitates the assembly of components onto circuit boards.

What is claimed is:

1. Apparatus for positioning a component on a circuit board comprising a generally rectangular insulating member having index projections extending horizontally outward from each outer edge thereof for insertion between adjacent terminals of the component and registration pins projecting from the bottom of said insulating member for insertion into holes of the circuit board and enabling said index projections to align and engage said component terminals with printed wiring circuitry of the circuit board and further having projections extending vertically from an upper surface thereof for maintaining the component in a spaced apart relationship with respect to said insulating member and wherein said registration pins each have a shoulder portion for maintaining said insulating member in a spaced apart relationship with respect to the circuit board with said component terminals in contact with the circuit board.

2. The component positioning apparatus set forth in claim 1 comprising a spring member having end sections each formed to grasp an edge of the circuit board and a center section formed to engage the component to maintain said component terminals in engagement with said printed wiring circuitry of the circuit board.

3. Apparatus for positioning a component having contact springs on a circuit board comprising a generally rectangular insulating member having pairs of rectangular elements fabricated of electrically insulating material and connected together at the ends thereof to form a quadrilateral member having outer edges sized to conform to edge dimensions of the component and index projections located and extending horizontally outward from each outer edge of said insulating member and formed for insertion between predetermined ones of adjacent contact springs of the component and having registration pins independent of said index projections projecting from the bottom of said insulating member and formed for insertion into datum holes located in the circuit board and enabling said index projections to align and engage said component contact springs with the circuit board and having projecting members extending from the top of said insulating member formed to cooperate with said registration pins to maintain said insulating member in a spaced apart relationship with the component and circuit board for enabling each component contact spring to be directly soldered with corresponding printed wiring circuitry of the circuit board.

4. The component positioning apparatus set forth in claim 3 wherein each of said rectangular elements has a pair of said index projections each located at a predetermined distance from one end thereof and each integral with and extended horizontally outward from an edge of said rectangular element for insertion between said adjacent contact springs of the component.

5. The component positioning apparatus set forth in claim 4 wherein each of said rectangular elements has a projecting member extending vertically upward from a surface thereof for maintaining said quadrilateral member in a spaced apart relationship with respect to the component.

6. The component positioning apparatus set forth in claim 5 wherein each of said registration pins has a shoulder section for maintaining said quadrilateral member in a spaced apart relationship with respect to the circuit board with said component contact springs in engagement with the circuit board.

7. The component positioning apparatus set forth in claim 6 wherein said apparatus comprises a spring member having a U-shaped center section for engaging the component and end sections extending outward from said U-shaped center section configured with a clasp section for engaging an edge of the circuit board and maintaining contact surfaces of said component contact springs in engagement with corresponding contact pads of the circuit board.

8. Apparatus for positioning a component on a circuit board and interconnecting terminals of the component with the circuit board comprising
 a generally rectangular member fabricated of insulating material for locating the component on the circuit board,
 a plurality of index projections each extending horizontally outward from an outer edge of said insulating member for insertion between adjacent terminals of the component,
 a plurality of registration pins projecting from a bottom surface of said insulating member for insertion into datum holes located in the circuit board to enable said index projections to align the component terminals with the circuit board and each said registration pin having a shoulder section for maintaining said insulating member in a spaced apart relationship with respect to the circuit board,
 a plurality of spacer projections extending vertically from an upper surface of said insulating member for maintaining said insulating member in a spaced apart relationship with respect to the component, and
 a spring member having a U-shaped center section for engaging the component and end sections extending outward therefrom configured for engaging an edge of the circuit board and maintaining a contact surface of each component terminal in engagement with a corresponding contact pad of the circuit board.

9. Apparatus for positioning a component on a circuit board and interconnecting contact springs of the component with contact pads of the circuit board comprising
 a generally rectangular member fabricated of electrically insulating material having index projections extending horizontally outward from edges thereof for insertion between adjacent ones of the component contact springs and registration pins having an upper shoulder portion for maintaining said insulating member in a spaced apart relationship with the circuit board and with a smaller sized lower portion projecting from a bottom surface of said shoulder portion for insertion into datum holes of the circuit board to align the component contact springs with corresponding ones of the circuit board contact pads,
 spacer members located on upper surfaces of said insulating member arranged in combination with said registration pin shoulder portions for maintaining the component in a spaced apart relationship with respect to the circuit board and said insulating member, and
 a spring member having end sections each formed to grasp an edge of the circuit board and a U-shaped center section formed to engage the component for maintaining the component spring contacts in engagement with the circuit board contact pads.

10. The component positioning apparatus set forth in claim 9 wherein each said registration pin lower portion is sized to maintain an interference fit with said circuit board datum holes during soldering of said component contact springs 6 with the circuit board contact pads.

* * * * *